United States Patent
Bogner et al.

(10) Patent No.: US 10,187,047 B2
(45) Date of Patent: Jan. 22, 2019

(54) APPARATUS AND METHOD FOR PROCESSING AN INPUT-SIGNAL VOLTAGE

(71) Applicant: Infineon Technologies AG, Neubiberg (DE)

(72) Inventors: Peter Bogner, Wernberg (AT); Gerhard Maderbacher, Gleisdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/471,081

(22) Filed: Mar. 28, 2017

(65) Prior Publication Data

US 2017/0294904 A1 Oct. 12, 2017

(30) Foreign Application Priority Data

Apr. 6, 2016 (DE) .................. 10 2016 106 317

(51) Int. Cl.
  *H03M 1/06* (2006.01)
  *H03M 1/12* (2006.01)
  *H03K 5/24* (2006.01)
  *H03H 19/00* (2006.01)

(52) U.S. Cl.
  CPC ............. *H03K 5/24* (2013.01); *H03H 19/004* (2013.01)

(58) Field of Classification Search
  CPC .............................. H03K 5/24; H03H 19/004
  See application file for complete search history.

(56) References Cited

U.S. PATENT DOCUMENTS

| 4,728,811 | A | * | 3/1988 | Iida | G11C 27/026 |
| | | | | | 307/106 |
| 5,796,300 | A | * | 8/1998 | Morgan | H03F 1/303 |
| | | | | | 330/51 |
| 7,920,085 | B2 | * | 4/2011 | Lin | H03M 1/1014 |
| | | | | | 341/122 |
| 8,198,920 | B2 | * | 6/2012 | Chatal | G11C 27/024 |
| | | | | | 327/205 |
| 8,203,473 | B2 | * | 6/2012 | Ono | H03M 1/0607 |
| | | | | | 341/118 |
| 2014/0184435 | A1 | | 7/2014 | Wang et al. | |

OTHER PUBLICATIONS

German Patent Office, Office Action issued for DE 102016106317.7, 12 pages, dated Feb. 3, 2017.

* cited by examiner

*Primary Examiner* — Kenneth B Wells
(74) *Attorney, Agent, or Firm* — Schiff Hardin LLP

(57) ABSTRACT

A circuit for processing an input-signal voltage comprises an input capacitance coupled between an input node of the circuit and a sense node of a comparator and a reference capacitance coupled to the sense node of the comparator. A method for processing an input-signal voltage comprises configuring a reference capacitance coupled to an input capacitance; during a charge phase, charging the reference capacitance to a first-level reference voltage; and, during an operative phase, setting the input capacitance to an input-signal voltage to obtain, at the sense node, a sense voltage.

24 Claims, 9 Drawing Sheets

|  | PHASE_1 | PHASE_2 | PHASE_3 | PHASE_4 |
| --- | --- | --- | --- | --- |
| COMP_SEL_1 | CLOSED | CLOSED | OPEN | OPEN |
| COMP_SEL_2 | CLOSED | OPEN | CLOSED | OPEN |
| COMP_1 | SENSE | SENSE | REFRESH | REFRESH |
| COMP_2 | SENSE | REFRESH | SENSE | REFRESH |

800

|  | PHASE_1 | PHASE_2 | PHASE_3 | PHASE_4 | PHASE_5 |
|---|---|---|---|---|---|
| COMP_SEL_1 | OPEN | CLOSED | CLOSED | CLOSED | CLOSED |
| COMP_SEL_2 | CLOSED | OPEN | OPEN | OPEN | CLOSED |
| COMP_SEL_3 | OPEN | OPEN | CLOSED | CLOSED | OPEN |
| COMP_SEL_4 | CLOSED | CLOSED | OPEN | CLOSED | CLOSED |
| COMP_1 | REFRESH | SENSE | SENSE | SENSE | SENSE |
| COMP_2 | SENSE | REFRESH | SENSE | SENSE | SENSE |
| COMP_3 | SENSE | SENSE | REFRESH | SENSE | SENSE |

1000

|  | PHASE_1 | PHASE_2 | PHASE_3 | PHASE_4 |
|---|---|---|---|---|
| COMP_SEL_1 | OPEN | CLOSED | CLOSED | CLOSED |
| COMP_SEL_2 | CLOSED | OPEN | OPEN | OPEN |
| COMP_SEL_3 | OPEN | OPEN | CLOSED | CLOSED |
| COMP_SEL_4 | CLOSED | CLOSED | OPEN | OPEN |
| COMP_SEL_5 | OPEN | OPEN | OPEN | CLOSED |
| COMP_SEL_6 | CLOSED | CLOSED | CLOSED | OPEN |
| COMP_1 | REFRESH | SENSE | SENSE | SENSE |
| COMP_2 | SENSE | REFRESH | SENSE | SENSE |
| COMP_3 | SENSE | SENSE | REFRESH | SENSE |
| COMP_4 | SENSE | SENSE | SENSE | REFRESH |
| PATH_1 | COMP_2 | COMP_1 | COMP_1 | COMP_1 |
| PATH_2 | COMP_3 | COMP_3 | COMP_2 | COMP_2 |
| PATH_3 | COMP_4 | COMP_4 | COMP_4 | COMP_3 |

FIG. 10

APPARATUS AND METHOD FOR PROCESSING AN INPUT-SIGNAL VOLTAGE

The present disclosure relates to a circuit for processing an input-signal voltage using a threshold voltage.

In recent years voltage comparators have become typical building blocks in microcontrollers. Typically, accuracy of the comparator is important.

Accuracy of a comparator can be achieved at the time of manufacturing a device that includes the comparator. Given a predetermined input voltage, the comparator can be set so as to provide an expected output. However, there is a need for comparators that are accurate in the long term, that is, in spite of long term effects that, at the time of manufacturing, are negligible.

Often, there is a need for a comparator to continuously sense an input signal. Comparators that continuously accurately sense an input signal tend to be complicated and, therefore, such comparators are slow. However, there is also a need for comparators that are fast.

Further, an output signal of continuous time comparators tends to toggle when the input signal is close to a comparator threshold. Conventionally, a positive feedback loop is used to reduce toggling. However, a positive feedback loop that is accurate and fast requires a lot of area and consumes plenty of power. There is a desire to reduce surface area required for circuitry related to the positive feedback and/or to reduce power consumption related to the suppression of toggling.

The independent claims define the invention in various aspects. The dependent claims state embodiments according to the invention in the various aspects. In the following, the disclosure will be further explained and described by means of specific example embodiments with reference to the enclosed drawings.

In one aspect, a circuit for processing an input-signal voltage comprises an input capacitance coupled between an input node of the circuit and a sense node of a comparator, and a reference capacitance coupled to the sense node of the comparator.

In one aspect, a method of processing an input-signal voltage comprises configuring a reference capacitance coupled to an input capacitance; during a charge phase, charging the reference capacitance to a first level reference voltage, and obtaining, at a sense node between the reference capacitance and the input capacitance, a threshold voltage; during an operative phase, setting the input capacitance to the input-signal voltage to obtain, at the sense node, a sense voltage; and forming a digital signal representative of the sense voltage being above or below the threshold voltage, e.g., being positive or negative.

In one aspect, a circuit for processing an input-signal voltage comprises a comparator including a sense node coupled to an input terminal for the input-signal voltage, and a reference capacitance coupled to the sense node, wherein the reference capacitance is configurable based on an output signal of the comparator.

In one aspect, a method for processing an input-signal voltage comprises storing charge on a reference capacitance; setting an input capacitance to the input-signal voltage, wherein the reference capacitance and the input capacitance share a common node; and setting a sense node of a comparator to a voltage at the common node, wherein a charge redistribution between the input capacitance and the reference capacitance via the common node is based on an output signal of the comparator.

In one aspect, a circuit for processing an input-signal voltage comprises a first comparator comprising a first-comparator sense node and a first-comparator output node; a second comparator comprising a second-comparator sense node and a second-comparator output node; a comparator select switch coupled between a path input terminal of the circuit and the first-comparator sense node and the second-comparator sense node; and an output circuit coupled to the first-comparator output and to the second-comparator output node; wherein the comparator select switch is configured to connect the path input terminal to at least one of the first-comparator sense node and the second-comparator sense node, and wherein the output circuit is configured to form a comparator output signal of the circuit based on a first-comparator output signal received from the first-comparator output node and/or on a second-comparator output signal received from the second-comparator output node.

In one aspect, a circuit for processing an input-signal voltage comprises a first comparator including a first-comparator sense node and a reference capacitance that is coupled to the first-comparator sense node; a second comparator including a second-comparator sense node; and a comparator select switch coupled between a path input terminal of the circuit and the first-comparator sense node and the second-comparator sense node, wherein the comparator select switch is configured to selectively couple the path input terminal to one of the first-comparator sense node and the second-comparator sense node.

In one aspect, a circuit for processing a plurality of input-signal voltages comprises a plurality of path input terminals coupled, via a plurality of comparators arranged in parallel, to a plurality of path output terminals, wherein the plurality of comparators comprises more comparators than there are path input terminals coupled to path output terminals; and an output circuit coupled to a plurality of output nodes of the plurality of comparators, wherein the output circuit is configured to form a plurality of comparator output signals of the circuit based on a logical combination of a plurality of output signals received from the plurality of comparator output nodes.

In one aspect, a circuit for processing a plurality of input-signal voltages comprises a plurality of path input terminals coupled, via a plurality of comparators arranged in parallel, to a plurality of path output terminals, wherein the plurality of comparators comprises more comparators than there are path input terminals coupled to path output terminals.

In one aspect, a method for processing at least one input-signal voltage in a circuit, wherein the circuit includes at least one path input terminal coupled, via a plurality of comparators, to at least one path output terminal, and wherein the plurality of comparators includes more comparators than there are path input terminals coupled to path output terminals, comprises, for each path input terminal, selectively making a coupling via one comparator of two comparators provided in parallel to form a coupling path from the path input terminal to an associated path output terminal, while breaking the coupling via the other comparator.

The novel features believed characteristic of the invention are set forth in the appended claims. The invention itself however, as well as a mode of use, further objects and advantages thereof, will best be understood by reference to the following detailed description of an illustrative embodiment when read in conjunction with the accompanying drawings, wherein FIG. 1 shows a block diagram that schematically illustrates a circuit in a first embodiment.

FIG. 10 shows a table that illustrates states of the circuit in FIG. 9.

Figure 1:
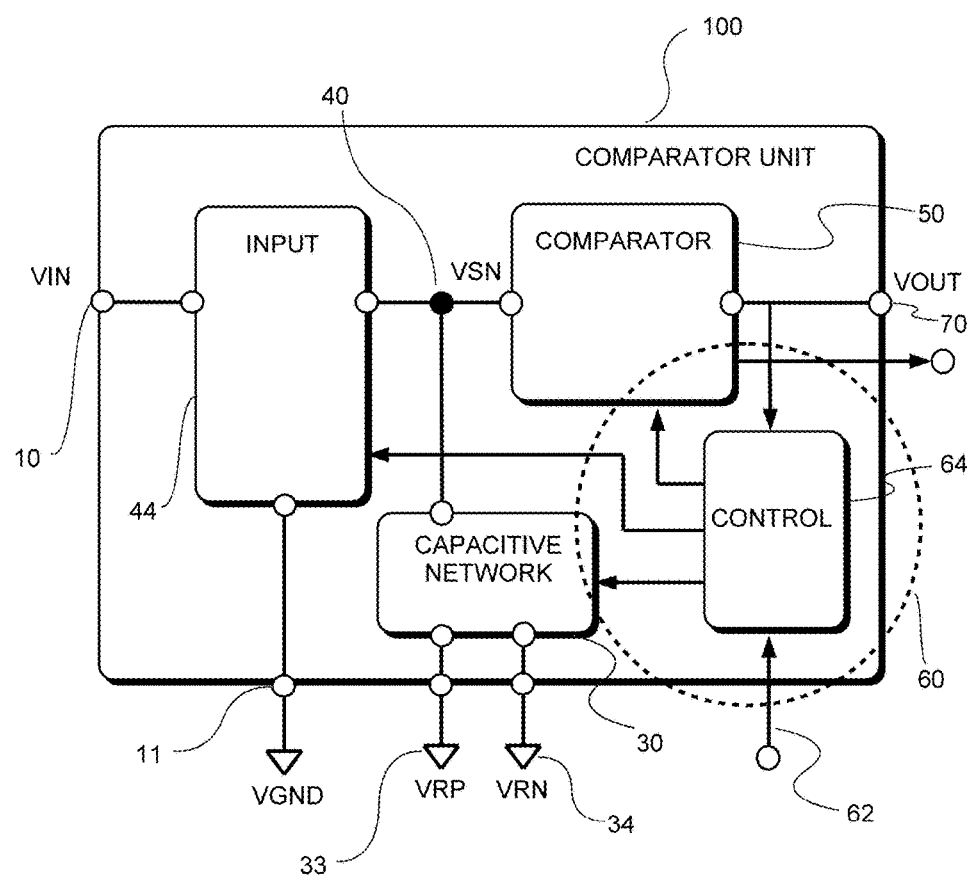

The present disclosure will now be described with reference to the attached drawing figures, wherein like reference numerals are used to refer to like elements throughout, and wherein the illustrated structures and devices are not necessarily drawn to scale. As used herein, like terms refer to like elements throughout the description. In some instances, well-known features are omitted or simplified to clarify the description of the exemplary implementations.

In one embodiment, a circuit in a comparator unit for processing an input-signal voltage VIN using a threshold voltage VTH comprises an input capacitance coupled between an input node of the circuit and a sense node of a comparator, and a reference capacitance provided as a capacitive network that is coupled to the sense node of the comparator. The comparator unit is herein also referred to as a comparator-function circuit block.

FIG. 1 shows a block diagram that schematically illustrates a circuit in one embodiment. The circuit is configured as a comparator-function circuit block 100, briefly also referred to as 'comparator block'. The comparator-function circuit block 100 comprises an input portion 44 that is coupled to an input terminal 10 of the comparator block 100 and to a ground terminal 11. The comparator block 100 comprises a comparator-circuit portion 50 that is coupled to the input portion 44 and to an output terminal 70. The comparator block 100 further comprises a reference capacitance 30 that, via a sense node 40, is coupled to the input portion 44 and to the comparator-circuit portion 50.

In some embodiments, in addition to the coupling of the reference capacitance 30 via the sense node 40 to the comparator-circuit portion 50, a control link 60 is provided to couple the comparator-circuit portion 50 to the reference capacitance 30. In some embodiments, the control link 60 is configured to provide an output signal from the comparator-circuit portion 50 as a control signal to the reference capacitance 30, for example, for use in control of the capacitive network in reference capacitance 30. In some embodiments, the control link 60 includes a control unit 64 configured to process an output signal, for example a digital output-signal voltage VOUT, received from the comparator-circuit portion 50 and, based on the output signal, to form the control signal. In some embodiments, the control unit 64 is configured to process an external control signal provided to the control unit 64 via an external control link 62. In some embodiments, the control unit 64 is configured to control, based on at least one of the output signals from the comparator-circuit 50 and the external control signal, the configuration of the capacitive network of the reference capacitance 30, for example switch settings. In some embodiments, the control unit 64 is configured to control the input portion 44. The control unit 64 can be any processing means, for example a microcontroller, or a programmable logic device, in particular, configured to or adapted to perform the acts described herein. The control unit 64 can be co-located with or form a portion of the comparator block 100. In some embodiments, the control unit 64 is located external to the comparator block 100.

Further, the reference capacitance 30 is coupled to a first-level reference voltage node 33 and to a second-level reference voltage node 34. In some embodiments, the reference capacitance 30 is coupled to one or more further-level reference voltage node(s) (not shown) such as a third-level reference voltage node. The reference capacitance 30 can be provided as a capacitive network. Thus, the reference capacitance 30 can comprise a plurality of capacitances. Generally, the reference capacitance 30 can be configurable in terms of size of capacitance connected to either the first-level reference voltage node 33 or to the second-level reference voltage node 34. As will be described in an example below, where the reference capacitance 30 is provided as a capacitive network, at least one capacitance of the plurality of capacitances of the capacitive network can be provided as a switched capacitance that is selectively controllable to configure the capacitive network.

The structure and operation of the comparator-function circuit block 100 (comparator block 100) will now be described in more detail.

Figure 2:
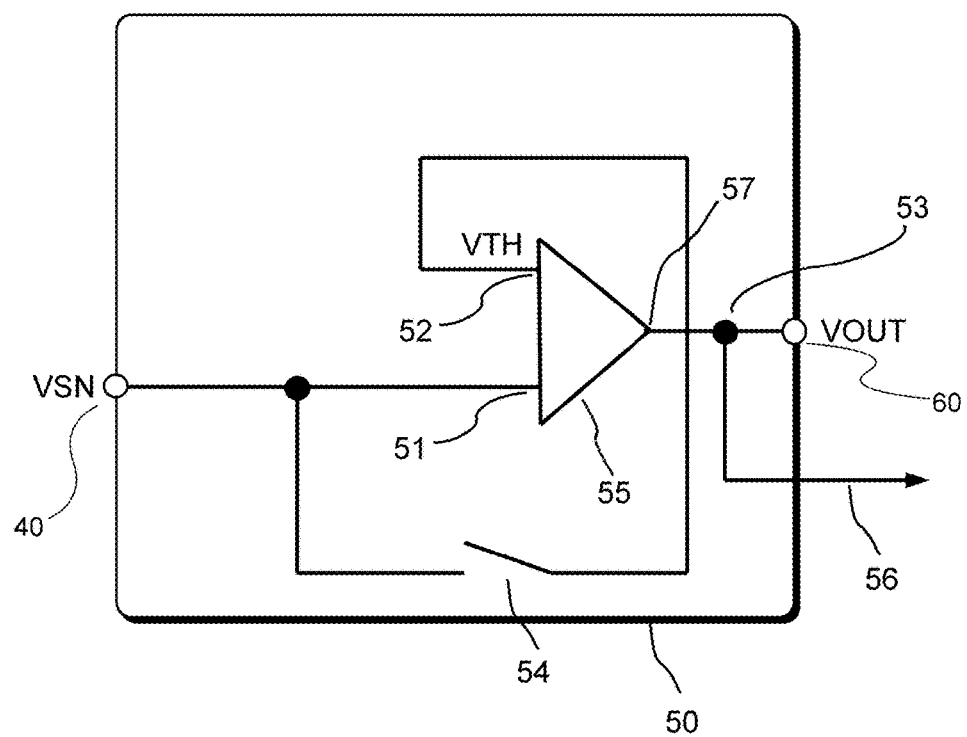
FIG. 2 shows a block diagram that illustrates an exemplary detail of the circuit shown in FIG. 1.

FIG. 2 shows a block diagram that illustrates an exemplary detail of the circuit shown in FIG. 1. Generally, the comparator-circuit portion 50 can include a comparator circuit 55 that is configured to operate as a differential comparator having a first sense node and a second sense node. In some embodiments, the first sense node of the comparator circuit 55 is also the sense node of the comparator-circuit portion 50, whereas the second sense node of the comparator circuit 55 is used as a reference node that can be kept internal to the comparator-circuit portion 50. The comparator circuit 55 can be configured to form an output-signal voltage VOUT to be representative of a voltage difference between the sense node and reference node being positive or negative. Thus, in effect, the output-signal is digital, i.e., representative of logical "0" and logical "1".

Still with reference to the embodiment illustrated in FIG. 2, now in more detail, the comparator-circuit portion 50 includes the comparator circuit 55 having the first sense node 51, the second sense node 52 and an output node 57. The first sense node 51 can be set to a sense-node voltage VSN. The second sense node 52 can be set to a threshold voltage VTH. The comparator circuit 55 is configured to compare the sense-node voltage VSN at the first sense node 51 to the threshold voltage VTH at the second sense node 52 and, at the output node 57, to output an output-signal voltage VOUT that is indicative of either the sense-node voltage VSN being larger than threshold voltage VTH or the threshold voltage VTH being larger than the sense-node voltage VSN. Thus, the output signal from the comparator circuit 55 is digital.

Still with reference to the embodiment illustrated in FIG. 2, the circuit can further comprise a common mode switch 54 coupled between the first sense node 51 and the second sense node 52 of the comparator circuit 55. The first sense node 51 and the second sense node 52 can be connected via the common mode switch 54.

The output node 57 is coupled, via a branch node 53, to the control link 60. Based on the output-signal voltage VOUT, the control link 60 can carry an output signal from the comparator circuit 55. The control link can be implemented as a wireline. A wireless implementation can also be contemplated, for example in order to filter the output signal to be transmitted via the control link from noise or otherwise reduce an effect of noise on the output signal. As discussed above with reference to FIG. 1, the control link 60 can encompass the control unit 64 (not shown in FIG. 2). In some embodiments, the second sense node 52 of the comparator circuit 55 is coupled, via the common mode switch 54, to a bias voltage output node of the comparator (not shown). At least one effect can be that, using an external bias voltage, an offset of the comparator circuit 55 can be adjusted.

Generally, the circuit of the comparator-function circuit block 100 can have the input terminal configured to be set to the input-signal voltage VIN. An input switch can be coupled between the input terminal and the input node. In some embodiments, the circuit further comprises a reference terminal configured to be set to a reference input voltage, and a reference switch coupled between a reference terminal and the input node, wherein the reference switch is configured to be closed while the common mode switch is closed. In some embodiments, the reference terminal is configured to be set to a supply voltage. In some embodiments, the reference terminal is configured to be set to a voltage at ground VGND.

Figure 3:
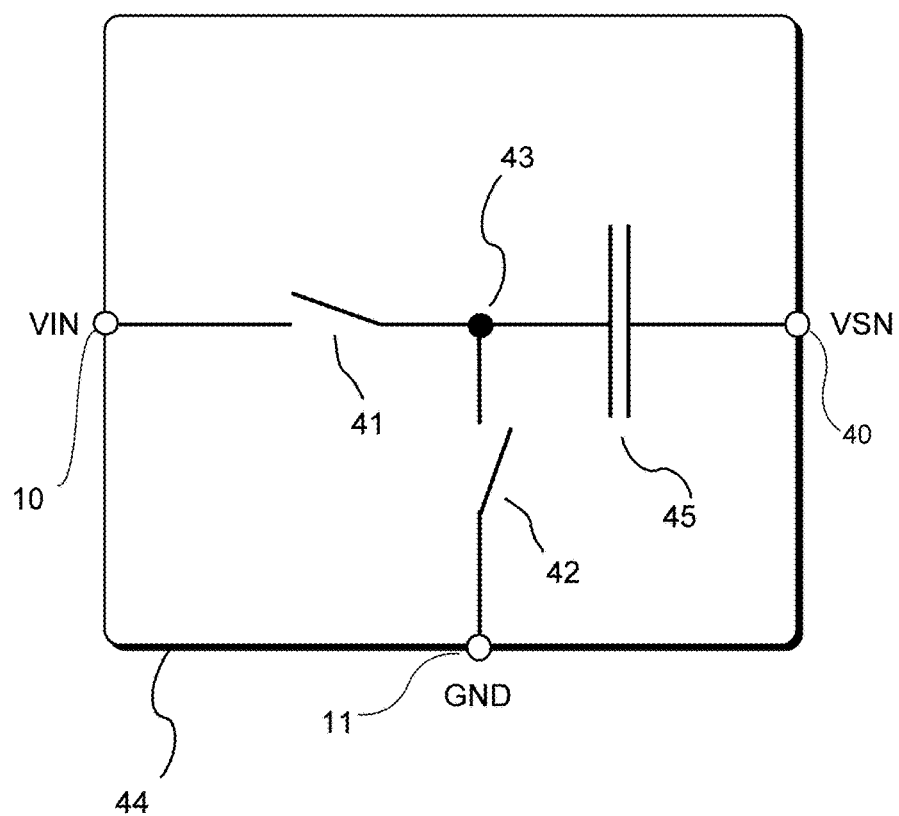
FIG. 3 shows a block diagram that illustrates an exemplary detail of the circuit shown in FIG. 1.

FIG. 3 shows a block diagram that illustrates an exemplary detail of the circuit of the comparator-function circuit block shown in FIG. 1. The input portion 44 of the circuit in comparator block 100 includes an input capacitance 45 having a first conductor coupled, via an input node 43 and an input switch 41, to the input terminal 10. Further, the first conductor is coupled, via the input node 43 and a ground switch 42, to the ground terminal 11. The input capacitance 45 has a second conductor that is coupled to the sense node 40. In some embodiments, the circuit is configured to have the input node 43 set to the input-signal voltage VIN while the common mode switch 54 is open. In some embodiments, the input switch 41 is configured to be open during a charge phase of 'refreshing' the charge on the input capacitance 45 and the reference capacitance 30 and to be closed during an operative phase of the circuit where, for example, the input-signal voltage is to be sensed. In some embodiments, the comparator block 100 is configured to have the input capacitance 45 set to a reference input voltage level VGND while the common mode switch 54 is closed. Thus, if the common mode switch 54 is closed, the first sense node 51 and the second sense node 52 are set to a same voltage, i.e., VTH=VSN. Further, the comparator block 100 can be configured to have the input capacitance 45 set to the reference input voltage level VGND so as to charge the reference capacitance 30.

Generally, in some embodiments, the at least one switched capacitance, via a first-level switch, is coupled to a first-level reference node, and, via a second-level switch, is coupled to a second-level reference node. In some embodiments, the the first-level switch and/or the second-level switch can be selectively controlled to configure the reference capacitance. In some embodiments, the first-level switch and the second-level switch are configured not to be simultaneously closed or simultaneously open. Nevertheless, it should be understood that in some implementations, during a process of switching, i.e., during a process of changing setting of the switch from open to closed or from closed to open, a transitory open state can occur where both the first-level switch and the second-level switch are open; likewise, in some implementations a transitory closed state can occur, where both the first-level switch and the second-level switch are closed. In some embodiments, the first-level switch and the second-level switch are integrated to form a toggle switch configured to establish a connection between the switched capacitance and either the first-level reference node or the second-level reference node.

Figure 4:
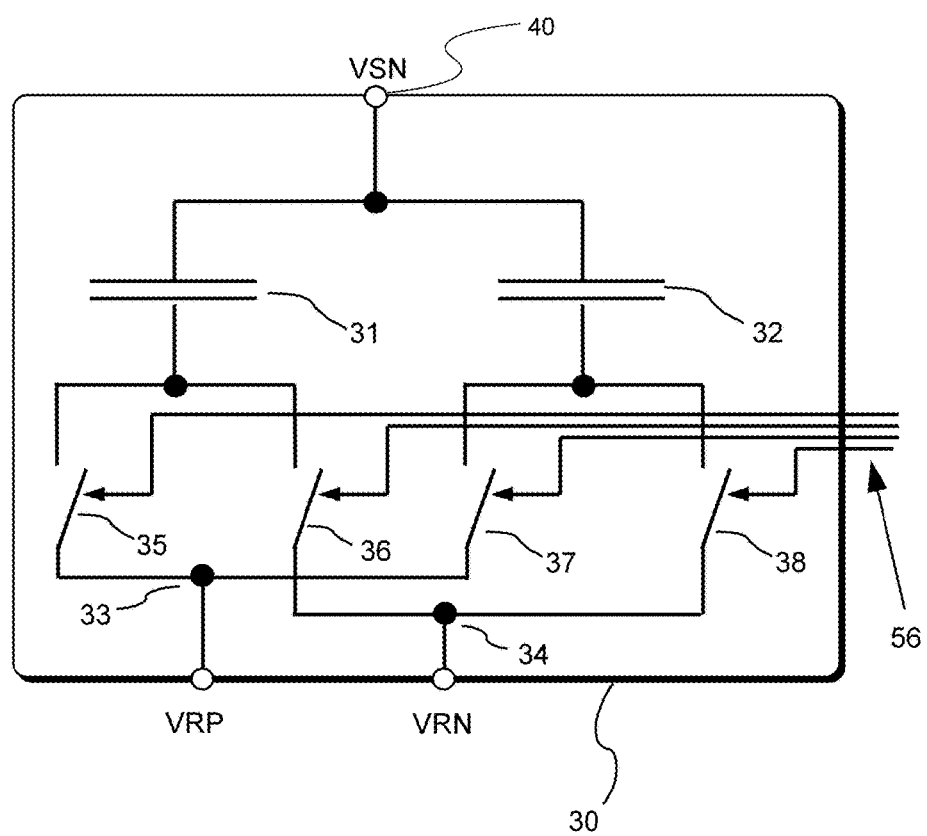
FIG. 4 shows a block diagram that illustrates an exemplary detail of the circuit shown in FIG. 1.

FIG. 4 shows a block diagram that illustrates another exemplary detail of the circuit in the comparator-function circuit block shown in FIG. 1. The capacitive network of reference capacitance 30 includes a first switched capacitance 31 and a second switched capacitance 32. While in the embodiment illustrated in FIG. 4, the capacitive network includes two switched capacitances, any other number of switched capacitances can be implemented as needed. In the example illustrated in FIG. 4, a capacitance value of the first switched capacitance 31 and a capacitance value of the second switched capacitance 32 are equal. However, in another implementation the capacitance value of the first switched capacitance 31 is twice as large as the capacitance value of the second switched capacitance 32. Generally, where the capacitive network includes a plurality of switched capacitances, these can be made in thermometer style, i.e., each having the same capacitance value, or they can be dimensioned in a binary style, i.e., with capacitance values being a predetermined minimum capacitance value times a power of two wherein the capacitance values of no two of the switched capacitances are the same. A first conductor of the first switched capacitance 31 and a first conductor of the second switched capacitance 32 are coupled to the sense node 40. A second conductor of the first switched capacitance 31 is coupled, via a first-level switch 35, to the first-level reference voltage node 33. Further, a second conductor of the first switched capacitance 31 is coupled, via second-level switch 36, to the second-level reference voltage node 34. The second conductor of the second switched capacitance 32 is coupled, via a first-level switch 37, to the first-level reference voltage node 33. Further, the second conductor of the second switched capacitance 32 is coupled, via a second-level switch 38, to the second-level reference voltage node 34. The first-level switches 35, 37 and the second-level switches 36, 38 are coupled to the control link 60 and configured to switch individually in accordance with the control signal provided via the control link 60. In some implementations a pair of, in the case of the first switched capacitance 31, first-level switch 35 and second-level switch 36 (in the case of the second switched capacitance 32, first-level switch 37 and second-level switch 38) is configured such that the first-level switch and the second-level switch cannot be simultaneously closed. In some embodiments the first-level reference voltage node 33 is set to a first level reference voltage, for example a predetermined and/or constant positive reference voltage VRP, while the second-level reference voltage node 34 is set to a second level reference voltage, for example a predetermined and/or constant negative reference voltage VRN. In some implementations, the voltage difference between the first level reference voltage and the second level reference voltage can be based on a semiconductor bandgap.

In some embodiments, the control unit 64 (not shown in FIG. 4) is configured to control the reference capacitance 30. In particular, in some implementations, the control unit 64 is configured to control the at least one switched capacitance 31, 32. The control unit 64 can be configured to process a signal received from the comparator-circuit portion 50 (not shown in FIG. 4) to configure, based on the signal, the reference capacitance 30. For example, the control unit 64 can be provided as a logic circuit. In some implementations, the logic circuit is configured to process the signal received from the comparator-circuit portion 50 as a digital signal. In some embodiments, the control unit 64 is configured to base control of the at least one switched capacitance 31, 32 on the comparator output-signal formed while the input node 43 is set to the reference input voltage level VGND. In some embodiments, the control unit 64 is configured to control the switched capacitance 31, 32 so as to compensate, at the sense node 51, a comparator offset voltage. In some embodiments, the switched capacitance control unit is configured to control the switched capacitance 31, 32 so as to set an effective threshold voltage to a predetermined value. For example, the control unit 64 can be configured to output a plurality of digital switch signals, each digital switch signal to control one switched capacitance of the plurality of switched capacitances 31, 32. In such an implementation, the control link 60 can include a plurality of control lines, each to connect to a different one of first-level switches 35, 37 and second-level switches 36, 38. In some embodiments, the switched capacitance control unit is configured to control the common mode switch 54 so as to have the common mode switch 54 is closed while the first-level switch 35, 37 is closed. At least one effect can that the reference capacitance 30 can be charged, for example, during a charge phase provided to recharge the reference capacitance to the first level reference voltage VRP. In some embodiments, the control unit is configured to have the reference capacitance 30 repeatedly charged. In some embodiments, the control unit is configured to have the reference capacitance 30 periodically charged. A duration of a period can be constant and predetermined. In some implementations, the duration can be subject to control by the control unit 64.

Now, in operation of the comparator-function circuit block 100, the input terminal 10 is set to an input-signal voltage VIN. Accordingly, the input-signal voltage VIN is supplied to the input portion 44. Further, using ground terminal 11, the input portion 44 can tap into a voltage at ground VGND. In some embodiments, the method further comprises, during the charge phase, charging the input capacitance 45 to a reference input voltage level VGND. It should be understood that the voltage at ground VGND can be any reference voltage defined as ground for the purpose of a given implementation. The input portion 44 contributes to a sense-node voltage VSN at the sense node 40 that is also applied at the comparator-circuit portion 50. The comparator-circuit portion 50 provides an output-signal voltage VOUT to the output terminal 70 of the comparator-function circuit block 100. Further, the comparator-circuit portion 50 sets the control link 60 to a control signal. The control signal is applied to the reference capacitance 30. The reference capacitance 30 tabs the positive reference voltage VRP at the first-level reference voltage node 33 and negative reference voltage VRN at the second-level reference voltage node 34. Further, the capacitive network of reference capacitance 30 contributes to the sense-node voltage VSN at the sense node 40. At least two modes, states or phases of operation can be distinguished according to how switches in the comparator block 100 are set. Below, a charge phase and an operative phase will be discussed in more detail. Additionally, at least in some implementations, a calibration phase and/or one or more types of transitory phases can be distinguished.

First, the comparator-function circuit block 100 is initialised. To this end, the charge phase is entered. During the charge phase, in the input portion 44, the ground switch 42 is closed while the input switch 41 is open. This will be further discussed below when describing a refresh of charges on the circuit's capacitances 31, 32, 45. In the comparator-circuit portion 50, the common mode switch 54 is closed. Thus, the threshold voltage VTH is set to both the first sense node 51 and the second sense node 52. In the capacitive network of reference capacitance 30, the first switched capacitance 31 and the second switched capacitance 32 can be controlled by a control signal. The control signal can be based on an output-signal voltage VOUT of the comparator circuit 55 and be provided via signal link 60. Control of the first switched capacitance 31 can be performed by using the first-level switch 35 and the second-level switch 36. Control of the second switched capacitance 32 can be performed by using the first-level switch 37 and the second-level switch 38. In some implementations, the control is performed such that charge on the first switched capacitance 31 and on the second switched capacitance 32 contributes to the sense-node voltage VSN so as to provide the effective threshold voltage of comparator block 100 as needed. Thus, the comparator block 100 can be set to a desired effective threshold voltage. In some implementations, the initialisation phase can be performed whenever a setting of an effective threshold voltage is desired.

In some implementations, the initialisation is extended to perform a further calibration of the comparator-circuit portion 50, for example, to take account of a comparator offset introduced when opening the common mode switch 54 from the closed setting during the charge phase.

Next, the operative phase is entered. During the operative phase, in the input portion 44, the input switch 41 is closed while the ground switch 42 is open. The input capacitance 45 is charged according to a difference of the sense-node voltage VSN to the input-signal voltage VIN. Thus, the input capacitance 45, in effect, divides the voltage VIN to provide a voltage contribution VIN'=a*VIN at the sense node 40, wherein a is some factor that can be smaller than 1. In the comparator portion, the common mode switch 54 is open. Thus, the comparator circuit 55 is operative to compare the sense-node voltage VSN that is applied to the first comparator sense node 51 to the threshold voltage VTH that is applied to the second comparator sense node 52. Since the first comparator sense node 51 and the second comparator sense node 52 form high resistance elements, the first comparator sense node 51 and the second comparator sense node 52 hardly affect the the sense-node voltage VSN. However, in the capacitive network of the reference capacitance 30, since, as described above with reference to the initialisation, the first switched capacitance 31 and the second switched capacitance 32 are individually switched to one of the first-level reference voltage VRP and the second-level reference voltage VRN, charge on the first switched capacitance 31 and the second switched capacitance 32 can contribute to the sense-node voltage VSN. An effect can be that, as the case may be, while the sense-node voltage VSN follows the input-signal voltage VIN, the sense-node voltage VSN is shifted by a constant voltage VCN with respect to the input-signal voltage VIN such that VSN=a*VIN+VCN. Thus, a difference deltaVIN in the input-signal voltage is reflected in a difference deltaVSN in the sense-node voltage deltaVSN=a*deltaVIN, and the constant voltage VCN causes a constant shift of the effective threshold voltage with respect to the threshold voltage VTH. While the constant voltage VCN is constant in the sense that it does not depend on the input-signal voltage VIN, it can still be varied, as explained above with respect to the initialisation phase, by switching the first switched capacitance 31 and by switching the second switched capacitance 32 either to the first-level reference voltage VRP or to the second-level reference voltage VRN so as to collectively store a capacitive network charge as a sum of charge on the first switched capacitance 31 and on the second switched capacitance 32. There is no shift of the sense-node voltage VSN, as long as the voltage across the input capacitance is constant. If the input-signal voltage VIN changes, the comparator output-signal voltage can change and the control unit 64 can provide a control signal to the capacitive network of the reference capacitance 30 to switch one or more of the first-level switches and the second-level switches. Thus, the charge redistributed between the switched capacitances 31, 32 and the input capacitance 45 can be changed. Therefore, the constant voltage VCN is changed. Due to the rebalancing of charges on the input capacitance 45 and in the capacitive network of the reference capacitance 30, a new effective threshold voltage of the comparator-function circuit block 100 is obtained. Thus, even if the input-signal voltage VIN is constant, switching one or more of the switched capacitances 31, 32 can change the output signal at the output node of the comparator 55.

During the next charge phase, in the comparator portion, the common mode switch 54 is, again, closed and the comparator circuit 55 is operative to compare the sense-node voltage VSN that is applied to the first comparator sense node 51 to the threshold voltage VTH that is applied to the second comparator sense node 52. In some implementations, for example, using the coupling of the second comparator sense node 52 to the bias voltage output node of the comparator (not shown), the threshold voltage VTH can be adjusted to a bias point of the comparator 55. However, in the input portion 44, the input switch 41 is open. Therefore, the sense-node voltage VSN is no longer based on the input-signal voltage VIN. Meanwhile, the ground switch 42 is closed, and the input capacitance 45 is charged according to a difference of the sense-node voltage VSN to the voltage at ground VGND, whereby charge on the input capacitance, in effect, is refreshed. Accordingly, the charge phase can also be referred to as a refresh phase. For example, as described above, the charge phase is performed during initialisation when the input capacitance 45 and/or the reference capacitance 30 is charged for use during the operative phase wherein the comparator circuit 55 processes the input-signal voltage VIN to provide the sense-node voltage VSN for comparison to the threshold voltage VTH. Further, the charge phase effects a refresh when the input capacitance 45 and/or the reference capacitance 30 is recharged to replace charge that, for example during a previous operative phase, leaked from the respective capacitance. In contrast, during the operative phase, in a case where the reference capacitance 30 is provided as the plurality of capacitances, charge can be redistributed from one capacitance to another of the plurality of capacitances.

An exemplary method of processing the input-signal voltage VIN to provide the sense-node voltage VSN for comparison to the threshold voltage VTH comprises configuring the reference capacitance 30 coupled to the input capacitance 45; during the charge phase, charging the reference capacitance 30 to the first level reference voltage VRP to obtain, at the sense node 40 between the reference capacitance 30 and the input capacitance 45, the sense-node voltage VSN; during the operative phase, setting the input capacitance 45 to the input-signal voltage VIN to obtain, at the sense node 40, the sense-node voltage VSN; and forming an output-signal voltage VOUT that is digital and representative of a difference between the threshold voltage VTH and the sense-node voltage VSN being positive or negative. Another exemplary method for processing the input-signal voltage VIN to compare the sense-node voltage VSN to the threshold voltage VTH comprises storing charge on the reference capacitance 30; setting the input-signal voltage VIN to the input capacitance 45, wherein the reference capacitance 30 and the input capacitance 45 share the sense node 40 as a common node; and setting the first sense node 51 of the comparator circuit 55 to the sense-node voltage VSN at the sense node 40, wherein the charge on the reference capacitance 30 is based on the output signal VOUT of the comparator circuit 55. In some embodiments, the configuring the reference capacitance 30 is based on the output signal VOUT of the comparator circuit 55. At least one effect can be that, depending on a configuration of the reference capacitance 30, an amount of charge on the reference capacitance 30 can be controlled.

Generally, in some embodiments, the method comprises a first mode of operation, wherein the comparator performs a comparison and a second mode of operation wherein the comparator performs a reset. In some implementations, the method comprises, during the charge phase, configuring the reference capacitance 30 so as to compensate, at the first sense node 51 of the comparator circuit 55, comparator offset voltage. In some embodiments, where the reference capacitance is provided as the plurality of switched capacitances 31, 32, the configuring the reference capacitance 30 includes selectively switching switched capacitances 31, 32. The switched capacitances 31, 32, when charging, can use one of at least a first reference voltage level VRP and a second reference voltage level VRN. Thus, in some embodiments, the method further comprises selectively setting the reference capacitance 30 to the second level reference voltage VRN, wherein the second level reference voltage VRN is below the first level reference voltage VRP and the input-signal voltage VIN is above the reference input voltage level VGND, or wherein the second level reference voltage is above the first level reference voltage and the input-signal voltage is below the reference input voltage. In some implementations, the configuring the reference capacitance is performed when the comparator performs the comparison. The method can further comprise, after the storing charge on the reference capacitance 30, redistributing the charges on the reference capacitance 30 and on the input capacitance 45.

In some embodiments, a difference between the first reference voltage level VRP and the second reference voltage level VRN is based on a bandgap voltage. In some embodiments, the method comprises, during the charge phase, feeding an output-signal voltage VOUT based on the digital signal fed back to the first sense node 51. The method, in some implementations with the comparator circuit being a differential comparator circuit, further comprises forming the digital signal so as to be representative of the voltage difference between the first sense node and the second sense node being positive or negative.

In one implementation, the control of the redistribution of charge on the reference capacitance 30 and in the input capacitance 45 can be used in a positive feedback scheme, sometimes also referred to as hysteresis, to avoid that the digital output signal voltage VOUT toggles. Conventionally, toggling can occur in a situation where an ideal input-signal voltage, i.e., having smooth development in time without noise, would simply 'cross' the threshold voltage, i.e., rise close or equal to the threshold voltage and then be larger than the threshold voltage, or vice versa. However, in practice, noise on the input-signal voltage and/or on the threshold voltage tends to provide, close to the crossing of the threshold voltage, a non-smooth development of the input-signal voltage that leads to multiple crossings when compared with the threshold voltage within a short interval of time. In this case, the digital output-signal voltage toggles. In contrast, the comparator-function circuit block 100 described herein, in one implementation, can be configured such that, upon detection of a change in the digital output-signal voltage VOUT, the reference capacitance 30 is configured so as to effectively increase a difference between the sense-node voltage VSN (input-signal voltage VIN) at the first sense node 51 of the comparator circuit 55 and the threshold voltage VTH at the second sense node 52 of the comparator circuit 55. In some implementations, the control unit 64 is configured to provide a control signal to the capacitive network of the reference capacitance 30 that switches, for example, the first switched capacitance 31 and/or the second switched capacitance 32. Thus, in some embodiments, it can be achieved that most noise does not impact the input-signal voltage VIN so much as the voltage difference of the sense-node voltage VSN to the threshold voltage VTH. In some implementations, the comparator-function circuit block can include a switched hysteresis capacitance configured to store an amount of charge commensurate with a predetermined threshold voltage difference. In one example, the switched hysteresis capacitance forms part of the capacitive network of the reference capacitance 30. For example, the switches hysteresis capacitance is implemented as the second switched capacitance 32, dedicated for use in suppression of the noise effects, which is switched, as described above, irrespective of switch states of the other first switched capacitance(s) 31 of the capacitive network of the reference capacitance 30. In some implementations, the control unit can be configured to switch back the switched hysteresis capacitance after a predetermined interval has passed from switching the switched hysteresis capacitance. Thus, after having first detected a crossing, if the input-signal voltage changes periodically, the predetermined interval can be used for future switching of the switched hysteresis capacitance. In particular, in some implementations, the switching can be controlled so as to occur even slightly before the crossing happens so as to suppress any occurrence of toggling in the digital output-signal voltage even further.

More generally, in one aspect a circuit for processing an input-signal voltage comprises a voltage processing device including a sense node coupled to an input terminal for the input-signal voltage. The circuit, in some embodiments, comprises an input capacitance coupled between the sense node and the input terminal. The circuit comprises a reference capacitance coupled to the sense node. In some embodiments, the reference capacitance and the input capacitance share a common node that is coupled to the sense node. In some embodiments, the reference capacitance is configurable based on an output signal of the voltage processing device. In some embodiments, the input capacitance is configurable based on an output signal of the voltage processing device. The voltage processing device can be configured to form an output signal voltage based on a voltage at the sense node. In some embodiments, the voltage processing device is provided as a comparator configured to form the output signal voltage based on a comparison of the voltage at the sense node to a threshold voltage.

Some embodiments of the circuit further comprise a control unit configured to configure, based on the signal received from the voltage processing device, the reference capacitance and/or the input capacitance. In some embodiments the control unit is provided as a logic circuit configured to process the signal received from the voltage processing device as a digital signal. In some embodiments, the voltage processing device is configured to operate at least in a first mode of operation where the voltage processing device performs the processing of the voltage at the sense node to form the output signal voltage. For example, the voltage processing device can be provided as a comparator configured to perform a comparison of the voltage at the sense node to a threshold voltage. Further, the voltage processing device can be configured to operate in a second mode of operation where the circuit performs a reset. For example, the voltage processing device performs a reset. In some embodiments, the control unit is configured to configure the reference capacitance so as to change an amount of charge on the reference capacitance when the voltage processing device processes the voltage at the sense node, for example, where the voltage processing device is provided as a comparator, by way of comparison of the voltage at the sense node to the threshold voltage.

In some embodiments, the reference capacitance, via a first level switch, is coupled to a first-level reference node. In some embodiments, the reference capacitance, via a second level switch, is coupled to a second-level reference node. A difference between a voltage at the first-level reference node and a voltage at the second-level reference node can be based on a bandgap voltage. In some embodiments, the difference of the voltage at the first-level reference node and the voltage at the second-level reference node is ratiometrically predetermined or ratiometrically determined during operation of the circuit.

In some embodiments the reference capacitance is configurable in terms of size. For example, in some implementations, the reference capacitance is provided as a plurality of switched capacitances. In some embodiments the input capacitance is configurable in terms of size. For example, in some implementations, the input capacitance is provided as a plurality of switched capacitances. In some embodiments both the reference capacitance and the input capacitance include at least one switched capacitance. The at least one switched capacitance can be controllable by the control unit. In some implementations, the control unit is provided as a logic circuit configured to output a plurality of digital switch signals, each digital switch signal to control one switched capacitance of the plurality of switched capacitances. In some embodiments, the reference capacitance or the input capacitance includes a switched hysteresis capacitance configured to selectively contribute, based on the output signal voltage, a predetermined charge in the charge redistribution.

As described above with reference to the comparator-function block, the control of the redistribution of charge in the reference capacitance and in the input capacitance can generally be used in a positive feedback scheme. The positive feedback scheme can be implemented in embodiments of a circuit that has a voltage processing device configured to form, based on the voltage at the sense node, an output signal voltage in order to avoid that the digital output signal voltage toggles. In an aspect, therefore, a method for processing an input-signal voltage comprises storing charge on a reference capacitance and setting an input capacitance to the input-signal voltage. The method further comprises performing a charge redistribution between the reference capacitance and the input capacitance. The method further comprises, based on the charge redistribution, deriving an output signal. In some implementations, a product of the voltage across the reference capacitance and the ratio of the size of the reference capacitance and the size of charge on the input capacitance and the size of charge on the reference capacitance are based on the output signal.

In some implementations, the method further comprises setting a first voltage across the input capacitance to a first predetermined reset voltage value. In some implementations, the method further comprises setting a second voltage across the reference capacitance to a second predetermined reset voltage value. In some implementations, the deriving the output signal is performed during a first mode of operation. In some implementations, the setting the first voltage across the input capacitance and the setting the second voltage across the reference capacitance are performed during a second mode of operation that differs from the first mode of operation. In some implementations, the method further comprises scheduling the first mode of operation and the second mode of operation in an alternate sequence.

In some implementations, the method further comprises, based on the output signal, at least one of configuring the size of the reference, configuring the size of the input capacitance, and setting the voltage across the reference capacitance. In some implementations, the reference capacitance is provided as a plurality of switched capacitances, wherein the configuring the reference capacitance includes selectively switching switched capacitances. In some implementations, the switched capacitances, when charging, use one of at least a first reference voltage level and a second reference voltage level. In some implementations, a difference between the first reference voltage level and the second reference voltage level is based on one of a group consisting of a bandgap voltage and a ratiometrically determined voltage.

In some implementations, the deriving the output signal includes comparing a voltage at a node between the input capacitance and the reference capacitance to a threshold voltage. In some implementations, the method further comprises, based on a result of the comparing, forming the output signal.

Now, further implementations of the above-described circuits and methods will be disclosed in a broader perspective. Generally, an exemplary circuit for processing an input-signal voltage comprises a first comparator including a first-comparator sense node and a first-comparator output node and a second comparator comprising a second-comparator sense node and a second-comparator output node. The circuit further comprises a comparator select switch coupled between a common input terminal of the circuit, herein also referred to as a path input terminal, and the first-comparator sense node and the second-comparator sense node. The circuit further comprises an output circuit coupled to the first-comparator output and to the second-comparator output node. In some implementations, the comparator select switch is configured to connect the path input terminal to at least one of the first-comparator sense node and the second-comparator sense node. Further, the output circuit is configured to form a comparator output signal of the circuit based on a first-comparator output signal received from the first-comparator output node and/or on a second-comparator output signal received from the second-comparator output node. In some embodiments, the second comparator is structurally provided like the first comparator. In some embodiments, the second comparator is configured to operatively complement the first comparator. At least one effect will be explained by way of examples below: where first and second comparators are used in a complementary way, a continuous comparing operation can be achieved in a case where one or both of the first and second comparators operate discontinuously.

In some embodiments, if the setting of the comparator select switch is so as to connect the path input terminal to a single one of the first-comparator sense node and the second-comparator sense node, the output circuit is configured to form the comparator output signal based on a corresponding single one of the first-comparator output signal and the second-comparator output signal. In some embodiments, the circuit further comprises an input capacitance coupled between the comparator select switch and the first-comparator sense node. In some embodiments, the comparator select switch is configured to set the input-signal voltage to the input capacitance while the at least one switched capacitance is controlled so as to redistribute charge on the input capacitance and charge on the reference capacitance.

In some embodiments, the output circuit is configured to form the comparator output signal of the circuit based on a logical combination of the first-comparator output signal and the second-comparator output signal. In some embodiments, the logical combination is a logical AND. In some embodiments, the output circuit is configured to form the comparator output signal based on a setting of the comparator select switch. In some embodiments, the output circuit is configured to form the comparator output signal based on the logical combination, if the setting of the comparator select switch is so as to connect the input terminal to both the first-comparator sense node and the second-comparator sense node.

In some embodiments, the circuit further comprises a reference capacitance that is coupled to the first-comparator sense node, wherein the reference capacitance comprises at least one switched capacitance that is selectively controllable. In some embodiments, the comparator select switch is configured to disconnect the input terminal from the first-comparator sense node while the at least one switched capacitance is controlled so as to set an effective threshold voltage to a predetermined value.

Figures 5, 6:
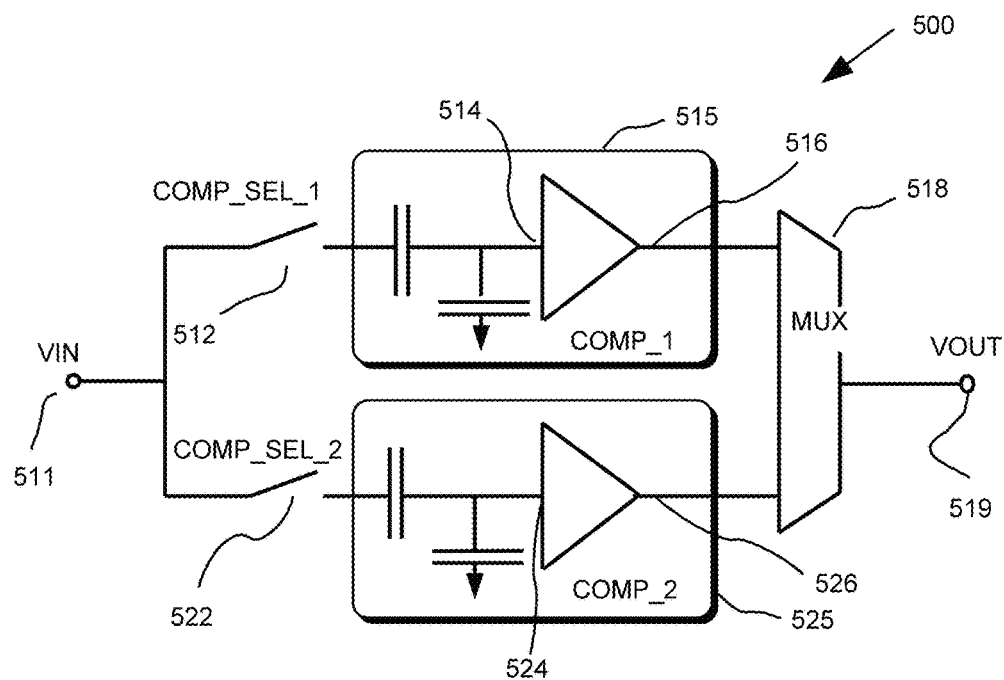
FIG. 5 shows a schematic diagram that illustrates a circuit in a third embodiment.
FIG. 6 shows a table that illustrates states of the circuit in FIG. 5.

FIG. 5 shows a schematic diagram that illustrates a circuit 500 in one embodiment configured to process an input-signal voltage VIN using an (internal) threshold voltage VTH. The circuit 500 includes a common input terminal, herein also referred to as path input terminal 511, a first comparator-function circuit block (comparator block) 515 having a first-comparator sense node 514 that is coupled to the path input terminal 511 via a first comparator select switch 512 and a second comparator block 525 having a second-comparator sense node 524 that is coupled to the path input terminal 511 via a second comparator select switch 522. In some embodiments, the second comparator block 525 is structurally provided like the first comparator block 515. The first comparator block 515 and/or the second comparator block 525 are configured as the comparator-function circuit block 100 described above with reference to FIGS. 1 to 4. In particular, a first reference capacitance can be coupled to the first-comparator sense node 514. In some embodiments, the second comparator block 525 comprises a second reference capacitance; the second reference capacitance can be coupled to the second-comparator sense node 524. In some embodiments, the input switch of the comparator-function circuit block 515, 525 implements or forms the comparator select switch 512, 522.

In the example illustrated in FIG. 5, the first comparator select switch 512 is controllable to couple the path input terminal 511 to the first-comparator sense node 514 and the second comparator select switch 522 is controllable to couple the path input terminal 511 to the second-comparator sense node 524. In some embodiments, the first comparator select switch 512 and the second comparator select switch 522 are provided collectively as one toggle switch (not shown). In some embodiments, the circuit 500 further comprises a first input capacitance coupled between the comparator select switch and the first-comparator sense node 514. The first comparator select switch 512 can be configured and/or controlled to set the input-signal voltage VIN to the input capacitance while the first comparator block 515 performs the comparison. Likewise, the circuit 500 can comprise a second input capacitance coupled between the second comparator select switch 522 and the second-comparator sense node 524. The second comparator select switch 522 can be configured and/or controlled to apply the input-signal voltage VIN to the input capacitance while the first comparator block 525 performs a comparing operation.

In some embodiments, a filter (not shown in FIG. 5) is coupled between the path input terminal 511 and the first-comparator sense node 514 and/or the second-comparator sense node 524. In some implementations, the filter can be provided as a low-pass filter configured to remove high-frequency noise resultant, for example, when operating the input switch of the comparator-function circuit block and/or the first and/or second comparator select switch(es). The filter can be configured to cancel noise during switching of the first comparator select switch 512 and/or the second comparator select switch 522. In some embodiments, the filter is controllable. At least one effect can be that a filter bandwidth can be controlled. In some embodiments, the filter comprises a plurality of switchable resistive elements.

Further, the circuit 500 includes an output multiplexer 518 that is coupled to an output node 516 of the first comparator block 515 and to an output node 526 of the second comparator block 525. The output multiplexer 518 is configured to form a multiplexed output signal, i.e., to selectively output a voltage signal output VOUT received from the first comparator block 515 and/or from the second comparator block 525 to a common output terminal, herein also referred to as path output terminal 519, that is coupled to the output multiplexer 518.

The first comparator block 515 and/or the second comparator block 525 is configured to operate at least in a first mode of operation wherein the first comparator block 515 (the second comparator block 525) performs a comparison and in a second mode of operation wherein the first comparator block 515 (the second comparator block 525) performs a reset. Further, the first comparator block 515 (the second comparator block 525) is configured to alternate the first mode of operation and the second mode of operation such that the first comparator block 515 (the second comparator block 525) performs the comparison intermittently. As used herein, the wording 'reset' encompasses a recharge of capacitances, for example, in order to replace charge that leaked, for example, during the first mode of operation, from the capacitance; a recharge of capacitances is also referred to as a 'capacitance refresh'. A reset can also encompass a re-adjustment, for example to accommodate a fluctuation due to a change in temperature of the comparator, of the comparator offset. A reset, in some cases, can also include a reconfiguration of the reference capacitance. Accordingly, while an interval during which the first comparator block 515 is operated in the first mode of operation herein is referred to as an 'operative phase' of the first comparator block 515, an interval during which the first comparator block 515 is operated in the second mode of operation is also referred to as a 'charge phase' of the first comparator block 515. Similarly, while an interval during which the second comparator block 525 is operated in the first mode of operation herein is referred to as an operative phase of the second comparator block 525, the interval during which the second comparator block 525 is operated in the second mode of operation is also referred to a 'charge phase' of the second comparator block 525. In some embodiments, the first comparator select switch 512 is configured to disconnect the path input terminal 511 from the first-comparator sense node 514 while the first comparator block 515 performs the reset. Likewise, the second comparator select switch 522 is configured to disconnect the path input terminal 511 from the second-comparator sense node 524 while the second comparator block 525 performs the reset.

FIG. 6 shows a table 600 that illustrates states of the circuit in FIG. 5. The table 600 provides an exemplary overview of settings of the first comparator select switch (in the table referred to as COMP_SEL_1) 512 and of the second comparator select switch (in the table referred to as COMP_SEL_2) 522 as well as of states of the first comparator block 515 and of the second comparator block 525. In one phase (in the table: PHASE_1) both the first comparator select switch 512 and the second comparator select switch 522 are closed. Accordingly, both, the first comparator block 515 and the second comparator block 525, are in an operative mode (in the table referred to as SENSE). However, in some embodiments, the second comparator block 525 is configured to operatively complement the first comparator block 515. This is seen in other phases (in the table: PHASE_2 and PHASE_3) where the first comparator select switch 512 is closed while the second comparator select switch 522 is open (PHASE_2) and where, accordingly, the first comparator block 515 is in the operative mode (SENSE) while the second comparator block 525 is in the charge mode (in the table referred to as REFRESH), or vice versa (PHASE_3). At least one effect can be that, as long as the circuit 500 is operated according to one of the aforedescribed modes, the output multiplexer 518 can select an output-signal voltage VOUT to be provided to the path output terminal 519 that is based on the input-signal voltage VIN. In yet another phase (in the table: PHASE_4) both the first comparator select switch 512 and the second comparator select switch 522 are open. In some implementations, this can happen during start-up of the circuit 500 or another initialisation of the circuit 500, where no comparator block 515, 525 is operative. Should that mode of operation be implemented in further operation of the circuit, a further comparator (not shown in FIG. 5) could be switched in parallel to the circuit shown in FIG. 5 in order to provide an output-signal voltage at the path output terminal 519 that is continuously based on the input-signal voltage VIN. This will be described below with reference to an implementation illustrated in FIG. 7.

Generally, an exemplary circuit for processing a plurality of input-signal voltages comprises a plurality of path input terminals coupled, via a plurality of comparators arranged in parallel, to a plurality of path output terminals, wherein the plurality of comparators comprises more comparators than there are path input terminals coupled to path output terminals. The exemplary circuit further comprises an output circuit coupled to a plurality of output nodes of the plurality of comparators. The output circuit is configured to form a plurality of comparator output signals of the circuit based on a logical combination of a plurality of output signals received from the plurality of comparator output nodes. At least one effect can be a reduction of error in a digital output signal. One effect can be provision of a continuous time digital output signal despite a discontinuous comparator operation. Since some discontinuous comparator concepts, as explained above with reference, for example, to embodiments illustrated in FIG. 1 to FIG. 5, provide more precise comparison results than conventional continuous time comparators, one effect can be in a continuous time operation to achieve more precise comparison results.

In some embodiments, the path input terminals are each, via a coupling path uniquely associated with the path input terminal, associated with a different path output terminal. The coupling paths can each be configured to establish a connection between the path input terminal and the path output terminal. Thus, each path output terminal, via the respective coupling path, is uniquely associated with a different path input terminal. In some implementations, the circuit further comprises, in each coupling path between the path input terminals and the path output terminals at least two comparators and a comparator select switch coupled between the path input terminal and the comparators. The comparator select switch can be controllable to establish the connection from the path input terminal to at least one of the comparators.

In some implementations, in each coupling path, at least one of the at least two comparators is provided with a reference capacitance coupled to an input node of the comparator. In some implementations, the reference capacitance comprises at least one switched capacitance that is selectively controllable. The circuit can further comprise a control unit configured to selectively break a connection between the path input terminal and the path output terminal via the at least one comparator, at least one switched capacitance is controlled so as to set an effective threshold voltage to a predetermined value. In some embodiments, at least two coupling paths comprise a common comparator. In some implementations, the at least two coupling paths further comprise an input multiplexer coupled between the at least two coupling paths' path input terminals and the common comparator, wherein the input multiplexer is configured to combine the input received at the path input terminals of the at least two coupling paths into a combined input to be provided to the common comparator.

In some embodiments, the at least two coupling paths comprise an output select switch coupled between the common comparator and the output circuits of the at least two coupling paths. The output select switch can be controllable to establish a connection from the common comparator to a selected one of the at least two coupling paths' output circuits. In some implementations, the output circuit is configured to form, for each coupling path, a comparator output signal based on a setting of the comparator select switch. The output circuit can be configured, in each coupling path, to form the comparator output signal based on the logical combination of output signals received from the plurality of comparator output nodes of the at least two comparators, if the setting of the comparator select switch is so as to connect the path input terminal to more than one comparator. In some implementations, the output circuit is configured, in each coupling path, to form the comparator output signal, if the setting of the comparator select switch in the each coupling path is so as to connect the path input terminal to a single one of the comparators, based on an output signal of the single one of the plurality of the comparators. Examples of the above-described embodiments and exemplary implementations of the underlying concepts will now be discussed with reference to FIGS. 7 to 10.

Figure 7:
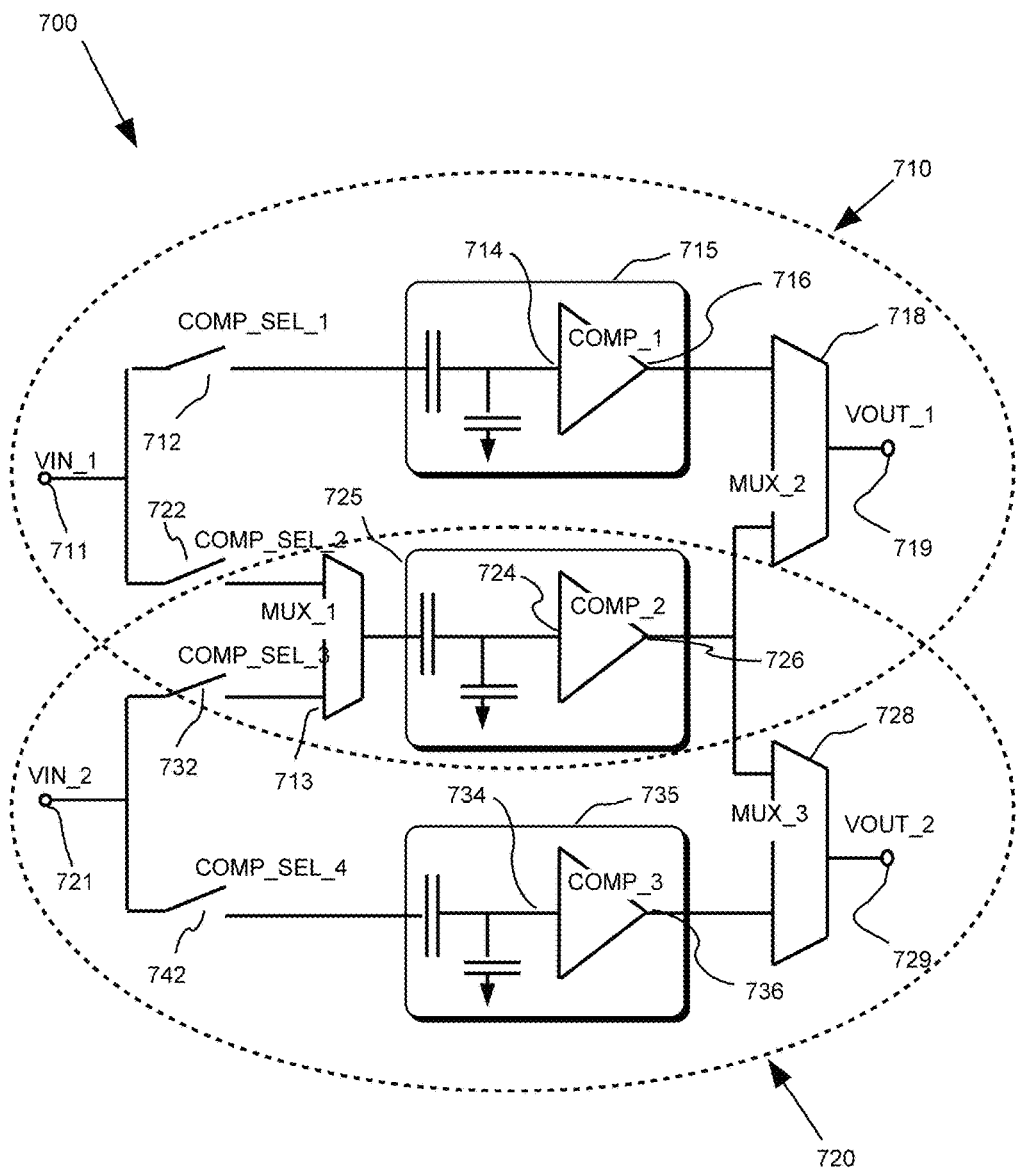
FIG. 7 shows a schematic diagram that illustrates a circuit in a third embodiment.

FIG. 7 shows a schematic diagram that illustrates a circuit 700 in a third embodiment. The circuit is configured to process a plurality of input-signal voltages VIN_1 and VIN_2 using a plurality of associated threshold voltages. The circuit 700 comprises a plurality of path input terminals (in the example illustrated in FIG. 7 these are a first path input terminal 711 and a second path input terminal 721) coupled, via a plurality of comparators (in the example illustrated in FIG. 7 these are a first comparator block 715, a second comparator block 725 and a third comparator block 735) arranged in parallel, to a plurality of output terminals (in the example illustrated in FIG. 7 these are a first path output terminal 719 and a second path output terminal 729). It should be noted that the number of comparator-function circuit blocks 715, 725, 735 (three in the example of FIG. 7) exceeds the number of path input terminals 711, 721 that are coupled, in the example, to a first path output terminal 719 and a second path output terminal 729 (thus, two path terminals in the example of FIG. 7). Generally, the path input terminals 711, 721 are each associated with a different path output terminal 719, 729. The association is established via a respective coupling path 710, 720 (in FIG. 7 merely schematically indicated by an encirclement with an elliptical broken line) that is uniquely associated with the path input terminal 711, 721. Thus, each path output terminal 719, 729, via the respective coupling path 710, 720, is uniquely associated with a different path input terminal 711, 721.

The coupling paths between the path input terminals 711, 721 and the path output terminals 719, 729 each comprise at least two comparators. In some implementations, the coupling paths are each configured to selectively establish a connection between the path input terminal and the path output terminal by one comparator only. In the example illustrated in FIG. 7, the first path input terminal 711 is coupled, via a first coupling path 710, to the first path output terminal 719. Generally, the coupling paths, for each of the at least two comparators, comprise an associated comparator select switch that is coupled between the path input terminal and an associated one of the at least two comparators. The comparator select switch can be controllable to establish the connection from the path input terminal to the associated one of the coupling path's at least two comparators. As shown with reference to the example illustrated in FIG. 7, the first coupling path 710 runs, via a first comparator select switch 712, to a first-comparator sense node 714 in the first comparator block 715, and, via second comparator select switch 722 and an input multiplexer 713, to a second-comparator sense node 724 in second comparator block 725. Generally, in some embodiments, the at least two coupling paths further comprise an input multiplexer coupled between the at least two coupling paths' input terminals and the common comparator. In some embodiments, the input multiplexer can be configured to select input received at the input terminals of the at least two coupling paths into a multiplexed input to be provided to the common comparator.

Now with reference to FIG. 7, to complete the first coupling path 710, the first comparator block 715 and the second comparator block 725 are coupled both, via a first output multiplexer 718, to the first path output terminal 719. Likewise, the second path input terminal 721 is coupled, via a second coupling path 720, to the second path output terminal 729. The second coupling path 720 runs, via a third comparator select switch 732 and the input multiplexer 713, to the second-comparator sense node 724 in the second comparator block 725, and, via a fourth comparator select switch 742, to a third-comparator sense node 734 in a third comparator block 735. The second comparator block 725 and the third comparator block 735 are coupled both, via a second output multiplexer 728, to the second path output terminal 729. Generally, the output multiplexer is configured to select one of an output received from the at least two comparators so as to form a multiplexed output signal to be provided at the path output terminal.

Generally, at least two coupling paths can comprise a common comparator. While both first coupling path 710 and second coupling path 720 include two comparators, the two coupling paths also share one comparator (the second comparator block 725). Accordingly, a control unit (not shown in FIG. 7) can be implemented that is configured to control settings of the comparator select switches 722, 732 so as to avoid a situation where the second comparator block 725 is simultaneously connected in the first coupling path 710 and in the second coupling path 720, at least at a time where the first input-signal voltage VIN_1 and the second input-signal voltage VIN_2 are set to the first path input terminal 711 and to the second path input terminal 721, respectively. Generally, the control unit can be configured to control the comparator select switch and/or the output select switch so as to selectively make or break the coupling path via the common comparator between the path input terminal and the path output terminal. The control unit can be configured to control the comparator select switches such that the multiplexed output signal seamlessly combines output from the comparators of the coupling path. At least one effect can be that the multiplexed output signal is continuously based on the input signal at the path input terminal which is associated with the respective path output terminal. As described above, the control unit can be configured to control the comparator select switch and/or the output select switch such that the combined output, at a time, consists of output from only one comparator. In some implementations, the control unit is provided as a state-machine.

Generally, at least one of the at least two comparators in one coupling path can be configured to operate at least in a first mode of operation, wherein the at least one of the at least two comparators performs a comparison, and in a second mode of operation, wherein the at least one of the at least two comparators performs a reset, herein also referred to as a refresh. As already discussed above with reference to the circuit illustrated in the example in FIG. 7, the control unit (not shown in FIG. 7) can further be implemented to control settings of the comparator select switches 712, 722, 732 and 742 so as to allow the first comparator block 715, the second comparator block 725 and/or the third comparator block 735 time for refresh of reference capacitance, where such capacitance is implemented, for example, in an implementation of the respective comparator according to the exemplary embodiment illustrated in FIGS. 1 to 4 and described above. In effect, in the illustrated implementation, while one comparator block 715 is allowed time for refresh, the other comparator blocks 725, 735 are connected each in a different one of the first coupling path 710 and the second coupling path 720. In some implementations, generally, the at least two coupling paths comprise an output select switch coupled between the common comparator and the path output terminals of the at least two coupling paths. In some embodiments, the output select switch is controllable to establish a connection from the common comparator to a selected one of the at least two coupling paths' path output terminals.

Figure 8:
FIG. 8 shows a table that illustrates states of the circuit in FIG. 7.

FIG. 8 shows a table 800 that illustrates states of the circuit in FIG. 7 when operated, for example, as described above. The table 800 provides an exemplary overview of settings of the first comparator select switch 712 (in the table 800 referred to as COMP_SEL_1), of the second comparator select switch 722 (COMP_SEL_2), of the third comparator select switch 732 (COMP_SEL_3) and of the fourth comparator select switch 742 (COMP_SEL_4). In an exemplary implementation as discussed above, the operation of the circuit 700 comprises, for each path input terminal 711, 721, selectively making a coupling via one comparator of two comparator blocks 715 and 725, 725 and 735 provided in parallel to form a coupling path 710, 720 from the path input terminal 711, 721 to an associated output terminal 719, 729, while breaking the coupling via the other comparator. This is illustrated in the table 800 that provides an exemplary overview of states of the first comparator block 715, of the second comparator block 725 and of the third comparator block 735. In a first phase (in the table 800 referred to as PHASE_1) the first comparator select switch 712 (COMP_SEL_1) is open, while the second comparator select switch 722 (COMP_SEL_2), is closed. Accordingly, the first comparator block 715 (in the table 800 referred to as COMP_1) is in the charge mode (in the table 800 referred to as REFRESH). The first input-signal voltage VIN_1 is thus provided to the second comparator block 725 (COMP_2) which is in the operative mode (in the table 800 referred to as SENSE). Meanwhile, the third comparator select switch 732 (COMP_SEL_3) is open. Thus, the second input-signal voltage VIN_2 is kept away from the first coupling path 710. The fourth comparator select switch 742 (COMP_SEL_4) is closed, whereby the second input input-signal voltage VIN_2 is provided to the third comparator block 735 (COMP_3) which is in the operative mode (SENSE).

However, in some embodiments, the second comparator block 725 is configured to operatively complement the first comparator block 715 and/or the third comparator block 735. This is seen in other phases (PHASE_2 and PHASE_3). In the second phase (PHASE_2) the first comparator select switch 712 and the fourth comparator select switch 742 are closed while the second comparator select switch 722 and the third comparator select switch 732 are open. Accordingly, the first comparator block 715 and the third comparator block 735 are in the operative mode (SENSE) while the second comparator block 725 is in the charge mode (REFRESH). Further, in a third phase (PHASE_3) the fourth comparator select switch 742 is open, while the third comparator select switch 732, is closed. Accordingly, the third comparator block 735 (COMP_3) is in the charge mode (REFRESH). The second input-signal voltage VIN_2 is thus provided to the second comparator block 525 (COMP_2) which is in the operative mode (SENSE). Meanwhile, the second comparator select switch 722 is open. Thus, the first input-signal voltage VIN_1 is kept away from the second coupling path 720. The first comparator select switch 712 is closed, whereby the first input input-signal voltage VIN_1 is provided to the first comparator block 715 (COMP_1) which is in the operative mode. At least one effect can be that, as long as the circuit 700 is operated according to one of the afore-described modes, in the first coupling path 710, the first output multiplexer 718 can, essentially continuously, receive an output-signal voltage VOUT_1 from either the first comparator block 715 or the second comparator block 725 to be provided to the first path output terminal 719 that is based on the first input-signal voltage VIN_1. Likewise, in the second coupling path 720, the second output multiplexer 728 can, essentially continuously, receive an output-signal voltage VOUT_2 from either the second comparator block 725 or the third comparator block 735 to be provided to the second path output terminal 729 that is based on the second input signal VIN_2.

In a fourth phase (PHASE_4), the first comparator select switch 712, the third comparator select switch 732 and the fourth comparator select switch 742 are closed while the second comparator select switch 722 is open. The first coupling path 710 uses the first comparator block 715 to form the first output-signal voltage VOUT_1. Having regard to the second coupling path 720, both the second comparator block 725 and the third comparator block 735 are used and the second output multiplexer 728 can select an output-signal voltage VOUT_2 from either the second comparator block 725 or the third comparator block 735 to be provided to the second path output terminal 729. The operation in the second coupling path 720 is thus similar to the operation during the fourth phase PHASE_4 of the table 600 in FIG. 6 that was discussed above with reference to FIG. 5. In some implementations, a logic circuit (not shown in FIG. 7) can base the output-signal voltage VOUT_2 on a logical combination, for example an AND combination, of the output signal provided from the second comparator block 725 and the output signal provided from the third comparator block 735.

In a fifth phase (PHASE_5), the first comparator select switch 712 and the fourth comparator select switch 742 are closed as in the fourth phase (PHASE_4), but the third comparator select switch 732 is open and the second comparator select switch 722 is closed. The difference in operation in the fourth phase (PHASE_4) is thus that the roles of the first coupling path 710 and the second coupling path 720 are exchanged. In one implementation, the fourth and/or the fifth phase can be transitional phases that occur during a transition between the first and the second phase and/or during a transition between the second and the third phase and/or during a transition between the third and the first phase. It should be understood that the wording 'transition' as used herein is not to be understood as limiting with respect to relative length, in particular to a duration of the transitional phase (PHASE_4, PHASE_5) should be much shorter than a duration of the other phases (PHASE_1, PHASE_2, PHASE_3). Further, the sequential numbering should not be understood to be limiting. For example transitional phase could also be implemented to occur between the third phase and the second phase or to occur between the third phase and the first phase or to occur between the second phase and the first phase.

Figure 9:
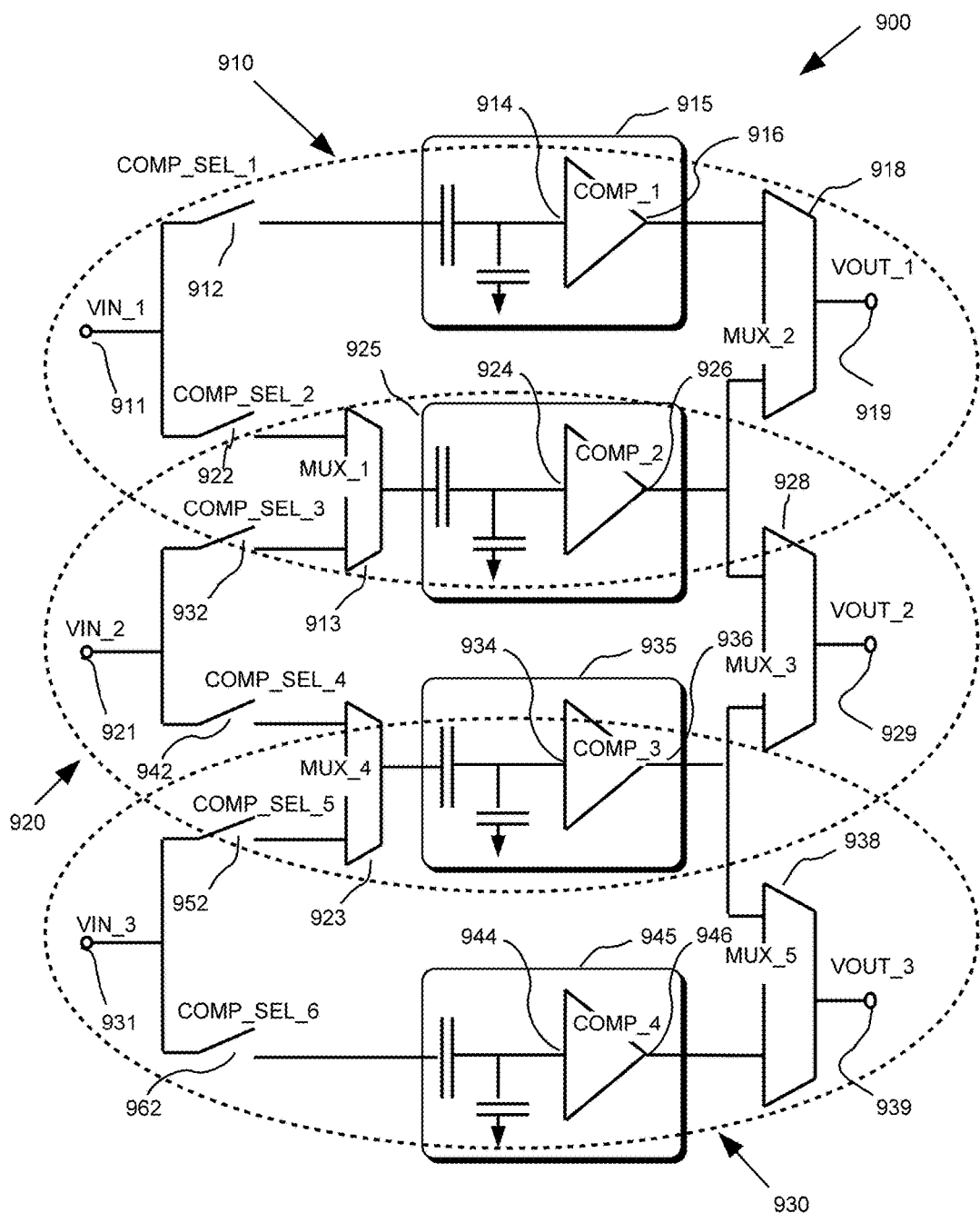
FIG. 9 shows a schematic diagram that illustrates a circuit in a second embodiment.

FIG. 9 shows a schematic diagram that illustrates a circuit 900 in a fourth embodiment. The circuit 900 is configured to process a plurality of input-signal voltages VIN_1, VIN_2, VIN_3 using a plurality of associated threshold voltages. The circuit 900 comprises a first path input terminal 911, a second path input terminal 921 and a third path input terminal 931 coupled, via a plurality of comparators (in the example illustrated in FIG. 9 these are a first comparator block 915, a second comparator block 925, a third comparator block 935 and a fourth comparator block 945 arranged in parallel, to a first path output terminal 919, a second path output terminal 929 and a third path output terminal 939. The circuit 900 resembles the circuit 700 illustrated as an example in FIG. 7 as well as the circuit 500 illustrated is a basic example in FIG. 5. In particular, it should be noted that the number of comparator blocks 915, 925, 935, 945 (four in the example of FIG. 9 as supposed to three in the example of FIG. 7) exceeds the number of input terminals 911, 921, 931 coupled to path output terminals 919, 929, 939 by one. Generally, the input terminals 911, 921, 931 are each, via a coupling path 910, 920, 930 that each is uniquely associated with one of the path input terminals 911, 921, 931, associated with a different path output terminal 919, 929, 939, whereby each path output terminal 919, 929, 939, via the respective coupling path 910, 920, 930, is uniquely associated with a different input path input terminal 911, 921, 931. The structure of the exemplary circuit 900 is conceptually similar to the structure of the exemplary circuits 500 and 700, discussed above in detail. Therefore, a detailed description will now be foregone. Instead, reference is made to the examples described above.

FIG. 10 shows a table 1000 that illustrates some exemplary states of the circuit in FIG. 9 when operated, for example, as described above. The table 1000 provides an exemplary overview of settings of the six comparator select switches 912, 922, 932, 942, 952, 962 (in the table 1000 referred to as COMP_SEL_1 . . . COMP_SEL_6). In an exemplary implementation, the operation of the circuit 900 comprises, for each input terminal 911, 921, 931, selectively making a coupling via one in a pair of comparator blocks 915 and 925, 925 and 935, 935 and 945 that are provided in parallel to form, pairwise, a coupling path 910, 920, 930 from the input terminal 911, 921, 931 to an associated output terminal 919, 929, 939, while breaking the coupling via the other comparator block in the respective pair. This is illustrated in the table 1000 that provides an exemplary overview of states of the first to fourth comparator blocks 915, 925, 935 and 945. In a first phase (in the table 800 referred to as PHASE_1) the first comparator select switch 912 is open, while the second comparator select switch 922, is closed. Accordingly, the first comparator block 915 (COMP_1) is in the charge mode (REFRESH). The first input-signal voltage VIN_1 is thus provided to the second comparator block 925 (COMP_2) which is in the operative mode (SENSE). Thus, during the first phase the first coupling path 910 (in the table 1000 referred to as PATH_1) uses the second comparator block 925 (COMP_2) but not the first comparator block 915. Meanwhile, the third comparator select switch 932 is open. Thus, the second input-signal voltage VIN_2 is kept away from the first coupling path 910. The fourth comparator select switch 942 is closed, whereby the second input input-signal voltage VIN_2 is provided to the third comparator block 935 (COMP_3) which is in the operative mode. Thus, during the first phase the second coupling path 920 (PATH_2) uses the third comparator block 935 (COMP_3) but not the second comparator block 925. Similarly, the fifth comparator select switch 952 is open. Thus, the third input-signal voltage VIN_3 is kept away from the second coupling path 920. The sixth comparator select switch 962 is closed, whereby the third input input-signal voltage VIN_3 is provided to the fourth comparator block 945 (COMP_4) which is in the operative mode. Thus, during the first phase the third coupling path 930 (PATH_3) uses the fourth comparator block 945 (COMP_4) but not the third comparator block 935.

As described above with reference to FIGS. 7 and 8, in some embodiments, the second comparator block 925 can be configured to operatively complement the first comparator block 915 and/or the third comparator block 935. In the embodiment illustrated in FIG. 9, further, the third comparator block 935 can be configured to operatively complement the second comparator block 925 and/or the fourth comparator block 945. An exemplary operation in the first to fourth phases (PHASE_1, PHASE_2, PHASE_3, PHASE_4) will now be discussed. During the first phase (PHASE_1) the second comparator block 925 (COMP_2) is in operative mode (SENSE) and used in the first coupling path 910 (PATH_1), whereby the first comparator block 915 (COMP_1) can be in charge mode (REFRESH), for example, to recharge its capacitances. During the third phase (PHASE_3) the second comparator block 925 (COMP_2) is in operative mode (SENSE) and used in the second coupling path 920 (PATH_2), whereby the third comparator block 935 (COMP_3) can be in charge mode (REFRESH), for example, to recharge its capacitances. In contrast, during the second phase (PHASE_2) the second comparator block 925 is cut from any input-signal voltage, since the second comparator select switch 922 (COMP_SEL_2) and the third comparator select switch 932 (COMP_SEL_3) are both open. Thereby, the second comparator block 925 (COMP_2) can be in charge mode (REFRESH), for example, to recharge its capacitances. Still during the second phase (PHASE_2), the third comparator block 935 (COMP_3) is in operative mode (SENSE) and used in the second coupling path 920 (PATH_2), whereby the second comparator block 925 (COMP_2) can be in charge mode (REFRESH), for example, to recharge its capacitances. During the fourth phase (PHASE_4) the third comparator block 935 (COMP_3) is in operative mode (SENSE) and used in the third coupling path 930 (PATH_3), whereby the fourth comparator block 945 (COMP_4) can be in charge mode (REFRESH), for example, to recharge its capacitances. In contrast, during the third phase (PHASE_3) the third comparator block 935 is cut from any input-signal voltage, since the fourth comparator select switch 942 (COMP_SEL_4) and the fifth comparator select switch 952 (COMP_SEL_5) are both open. Thereby, the third comparator block 935 (COMP_3) can be in charge mode (REFRESH), for example, to recharge its capacitances. Thus, while the comparator blocks 915, 925, 935, 945 each do not continuously operate in the operative mode, still a continuous output-signal voltage VOUT_1, VOUT_2, VOUT_3 based on an associated input-signal voltage VIN_1, VIN_2, VIN_3 is provided for each coupling path 910, 920, 930.

Generally, a method of processing at least one input-signal voltage in a circuit is disclosed herein. The circuit comprises, as described with reference to the examples described above and illustrated in FIGS. 5, 7 and 9, at least one path input terminal coupled, via a plurality of comparators, to at least one path output terminal, wherein the plurality of comparators comprises more comparators than there are path input terminals coupled to path output terminals. The method comprises, for each path input terminal, selectively making a coupling via one comparator of two comparators provided in parallel to form a coupling path from the path input terminal to an associated path output terminal, while breaking the coupling via the other comparator. In some implementations the method further comprises sharing the one comparator between at least a first coupling path from a first path input terminal to a first path output terminal and a second coupling path from a second path input terminal to a second path output terminal, In some implementations, in the second coupling path, the making the coupling via the one comparator comprises, in the first coupling path, breaking the coupling via the one comparator and, in the first coupling path, making the coupling via the other comparator. In some implementations, the method further comprises, during the breaking the coupling via the other comparator, charging a reference capacitance coupled to a sense node of the other comparator.

Arrangements and procedures of the described implementations may be implemented in a sensor system, a special purpose computer, a programmed microprocessor or microcontroller and peripheral integrated circuit element(s), an ASIC or other integrated circuit, a digital signal processor, a flashable device, a hard-wired electronic or logic circuit such as discrete element circuit, a programmable logic device such as PLD, PLA, FPGA, PAL, a modem, a transmitter/receiver, any comparable device, or the like. The disclosed arrangements may be implemented partially or fully in hardware using logic circuits or VLSI design.

In the above description of exemplary implementations, for purposes of explanation, specific numbers, materials configurations, and other details are set forth in order to better explain the invention, as claimed. However, it will be apparent to one skilled in the art that the claimed invention may be practised using different details than the exemplary ones described herein. Exemplary implementations/embodiments discussed herein may have various components collocated; however, it should be appreciated that the components of the arrangements may be combined into one or more apparatuses. As used herein, the wording 'circuit block' and 'circuit portion' should be understood functionally. Therefore, in some implementations, a circuit block may not structurally appear as such in circuitry of a product; elements of the circuit block may be distributed in various locations of the circuitry of the product. Likewise, a circuit portion can be distributed.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, terms such as 'first', 'second', and the like, are also used to describe various elements, regions, sections, etc. and are also not intended to be limiting. Where some implementations were described above with respect to a first and a second functionality, other implementations that are not illustrated can include only the first functionality (not second functionality) or can include only the second functionality (not the first functionality).

As used herein, the wording 'to perform continuously' is not necessarily to be understood as unconditionally 'always'. Conditions such as a prerequisite for a certain continuous mode of operation can be defined to be met as a requirement for a continuous performance. The continuous performance can be defined to last as long as the conditions are met. One condition can be activation of a continuous mode of operation having a predetermined condition for deactivation such as completion of a predetermined duration.

As used herein, the term 'or' is intended to mean an inclusive 'or' rather than an exclusive 'or.' That is, unless specified otherwise or clear from context, 'X employs A or B' is intended to mean any of the natural inclusive permutations. That is, if X employs A; X employs B; or X employs both A and B, then 'X employs A or B' is satisfied under any of the foregoing instances.

As used herein, the articles 'a' and 'an' should generally be construed to mean 'one or more,' unless specified otherwise or clear from context to be directed to a singular form.

As used herein, the wording 'reset' encompasses a recharge of capacitances in order to replace charge that leaked, for example, during the first mode of operation, from the capacitance; a recharge of capacitances is also referred to as a 'capacitance refresh'. A reset can also encompass a re-adjustment, for example to accommodate a fluctuation due to a change in temperature of the comparator, of the comparator offset. A reset, in some cases, can also include a reconfiguration of the reference capacitance.

In some embodiments a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods can be performed by any hardware apparatus.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a 'means') used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. It is to be understood that the features of the various embodiments described herein may be combined with each other, unless specifically noted otherwise.

The invention claimed is:

1. A circuit, for processing an input-signal voltage, comprising:
an input capacitance coupled between an input node of the circuit and a sense node of a comparator; and
a reference capacitance coupled to the sense node of the comparator, wherein the reference capacitance comprises a plurality of capacitances, at least one capacitance of the plurality of capacitances is provided as a switched capacitance that is selectively controllable to configure the plurality of capacitances, the at least one switched capacitance, via a first level switch, is coupled to a first level reference node, and, via a second level switch, is coupled to a second level reference node, the first level switch and/or the second level switch is selectively controllable to configure the reference capacitance, and a difference between a voltage at the first level reference node and a voltage at the second level reference node is based on a bandgap voltage.

2. The circuit of claim 1, further comprising:
a common mode switch coupled between the sense node and a reference node of the comparator,
wherein the circuit is configured to have the input capacitance set to a reference input voltage while the common mode switch is closed.

3. The circuit of claim 2,
wherein the circuit is configured to have the input node set to the input-signal voltage while the common mode switch is open.

4. The circuit of claim 2,
wherein the circuit is configured to have the input capacitance set to the reference input voltage while the reference capacitance is charged.

5. The circuit of claim 1,
wherein the first level switch and the second level switch are configured not to be simultaneously closed or simultaneously open.

6. The circuit of claim 5,
wherein the first level switch and the second level switch are integrated to form a toggle switch configured to establish a connection between the switched capacitance and either the first level reference node or the second level reference node.

7. The circuit of claim 1, the circuit further comprising:
a switched capacitance controller configured to control the at least one switched capacitance.

8. The circuit of claim 7,
wherein the switched capacitance controller is configured to base control of the at least one switched capacitance on a comparator output signal voltage formed while the input node is set to a reference input voltage.

9. The circuit of claim 7,
wherein the switched capacitance controller is configured to control the switched capacitance so as to compensate, at the sense node, a comparator offset voltage.

10. The circuit of claim 7,
wherein the switched capacitance controller is configured to control the switched capacitance so as to set an effective threshold voltage to a predetermined value.

11. The circuit of claim 7,
wherein the switched capacitance controller is configured to control the common mode switch so as to have the common mode switch closed while the first level switch is closed.

12. The circuit of claim 7,
wherein the controller is configured to have the reference capacitance repeatedly charged.

13. The circuit of claim 12,
wherein the controller is configured to have the reference capacitance periodically charged.

14. The circuit of claim 1, further comprising:
an input terminal configured to be set to the input-signal voltage, and
an input switch coupled between the input terminal and the input node.

15. The circuit of claim 14,
wherein the input switch is configured to be open during a charge phase of charging the input capacitance and the reference capacitance and closed during an operative phase of the circuit.

16. The circuit of claim 2, further comprising:
a reference terminal configured to be set to a reference input voltage, and
a reference switch coupled between the reference terminal and the input node,
wherein the reference switch is configured to be closed while the common mode switch is closed.

17. The circuit of claim 16,
wherein the reference terminal is configured to be set to a ground voltage.

18. The circuit of claim 2,
wherein the sense node of the comparator is coupled, via the common mode switch, to a bias voltage output node of the comparator.

19. A method for processing an input-signal voltage, the method comprising:

configuring a reference capacitance coupled at a sense node to an input capacitance;

during a charge phase, charging the reference capacitance to a first-level reference voltage;

during an operative phase, setting the input capacitance to an input-signal voltage to obtain, at the sense node, a sense voltage; and forming a digital signal representative of a difference between the sense voltage and a threshold voltage being positive or negative, wherein a difference between the first-level reference voltage and a second-level reference voltage is based on a bandgap voltage.

20. The method of claim 19, further comprising:
during the charge phase, charging the input capacitance to a reference input voltage level.

21. The method of claim 19, further comprising:
during the charge phase, configuring the reference capacitance so as to compensate, at the sense node, a comparator offset voltage.

22. The method of claim 19, further comprising:
selectively setting the reference capacitance to the second-level reference voltage, wherein the second-level reference voltage is below the first-level reference voltage and the input-signal voltage is above the reference input voltage, or wherein the second-level reference voltage is above the first-level reference voltage and the input-signal voltage is below the reference input voltage.

23. The method of claim 19, further comprising:
during the charge phase, feeding an output voltage based on the digital signal back to the sense node.

24. The method of claim 19, further comprising:
using a differential comparator with the sense node of the comparator being a first sense node and the comparator comprising a second sense node, and forming the digital signal to be representative of a voltage difference between first and second sense node being positive or negative.

* * * * *